United States Patent
Ham et al.

(10) Patent No.: US 10,184,175 B2
(45) Date of Patent: Jan. 22, 2019

(54) METHOD FOR SYNTHESIZING MULTILAYER GRAPHENE

(71) Applicant: GWANGJU INSTITUTE OF SCIENCE AND TECHNOLOGY, Gwangju (KR)

(72) Inventors: Moon-Ho Ham, Gwangju (KR); Myung-Woo Son, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/094,567

(22) Filed: Apr. 8, 2016

(65) Prior Publication Data

US 2016/0369394 A1    Dec. 22, 2016

(30) Foreign Application Priority Data

Jun. 16, 2015    (KR) ........................ 10-2015-0084785

(51) Int. Cl.
| | |
|---|---|
| *H01L 21/02* | (2006.01) |
| *C23C 16/26* | (2006.01) |
| *C23C 16/48* | (2006.01) |
| *C23C 14/06* | (2006.01) |
| *C25D 5/50* | (2006.01) |
| *C23C 28/00* | (2006.01) |
| *C30B 23/06* | (2006.01) |
| *C30B 25/18* | (2006.01) |
| *C30B 29/02* | (2006.01) |

(Continued)

(52) U.S. Cl.
CPC ............ *C23C 16/26* (2013.01); *C01B 32/186* (2017.08); *C23C 16/01* (2013.01); *C23C 16/0209* (2013.01); *C23C 16/0281* (2013.01); *C23C 28/322* (2013.01); *C23C 28/343* (2013.01); *C25D 5/50* (2013.01); *C30B 23/066* (2013.01); *C30B 25/18* (2013.01); *C30B 29/02* (2013.01); *H01L 21/0262* (2013.01); *H01L 21/02491* (2013.01); *H01L 21/02527* (2013.01)

(58) Field of Classification Search
CPC ........... H01L 21/02527; H01L 29/1606; C23C 16/26; Y10S 977/734
USPC ......................................................... 438/478
See application file for complete search history.

(56) References Cited

U.S. PATENT DOCUMENTS

| | | | | |
|---|---|---|---|---|
| 5,635,256 A | * | 6/1997 | Olson | ..................... C23C 16/02 |
| | | | | 427/249.8 |
| 9,388,048 B1 | * | 7/2016 | Zhou | ..................... C01B 31/04 |
| | | | | 264/430 |

(Continued)

*Primary Examiner* — Moazzam Hossain
(74) *Attorney, Agent, or Firm* — Hauptman Ham, LLP

(57) ABSTRACT

A method for synthesizing a multilayer graphene is provided. Specifically, the multilayer graphene can be produced by performing a step of forming a catalytic metal layer on a substrate, a step of heat-treating the catalytic metal layer on the substrate while supplying methane gas, and a step of synthesizing a multilayer graphene on the heat-treated catalytic metal layer. As described above, the multilayer graphene having a large area can be grown directly on a substrate, by heat-treating the catalytic metal layer using methane gas, prior to the step of synthesis of graphene. In addition, as the number of layer of the multilayer graphene can be controlled by changing the synthesis time of the multilayer graphene, the multilayer graphene with the desired number of layers can be easily produced.

10 Claims, 8 Drawing Sheets

(51) Int. Cl.
*C23C 16/01* (2006.01)
*C23C 16/02* (2006.01)
*C01B 32/186* (2017.01)

(56) References Cited

U.S. PATENT DOCUMENTS

| | | | | |
|---|---|---|---|---|
| 9,764,956 | B2* | 9/2017 | Moon | C01B 32/186 |
| 2011/0101265 | A1* | 5/2011 | Kambara | B01J 23/002 |
| | | | | 252/74 |
| 2012/0234240 | A1* | 9/2012 | Won | C23C 16/26 |
| | | | | 118/719 |
| 2013/0214252 | A1* | 8/2013 | Park | B82Y 30/00 |
| | | | | 257/29 |
| 2014/0120270 | A1* | 5/2014 | Tour | C23C 16/26 |
| | | | | 427/596 |
| 2014/0287155 | A1* | 9/2014 | Matsumoto | B01J 23/75 |
| | | | | 427/535 |
| 2014/0290565 | A1* | 10/2014 | Kim | B01J 23/72 |
| | | | | 117/94 |
| 2014/0374960 | A1* | 12/2014 | Cojocaru | C01B 31/0446 |
| | | | | 264/430 |
| 2015/0249034 | A1* | 9/2015 | Kondo | H01L 21/76251 |
| | | | | 438/151 |
| 2015/0360954 | A1* | 12/2015 | Davis | H01L 21/02318 |
| | | | | 427/275 |
| 2015/0371848 | A1* | 12/2015 | Zaretski | H01L 21/02527 |
| | | | | 438/496 |
| 2016/0282712 | A1* | 9/2016 | Kim | G03F 1/22 |
| | | | | 438/496 |
| 2017/0210629 | A1* | 7/2017 | Cho | C01B 31/0453 |

* cited by examiner

METHOD FOR SYNTHESIZING MULTILAYER GRAPHENE

TECHNICAL FIELD

The present invention relates to a method for synthesizing a multilayer graphene.

BACKGROUND OF ART

Graphene is a two-dimensional planar conducting material in which carbon atoms are bonded in a hexagonal lattice. Graphene has excellent electrical characteristics, flexibility, and high transparency and thus has been applied as a material for various electronic devices. Furthermore, since graphene has a planar structure, it has an advantage that it can be patterned by using a conventional etching method. Therefore, graphene can be easily applied to semiconductor and display device elements. However, due to a semi-metallic characteristic of graphene that has zero band gap, the application of graphene for the semiconductor device is limited. Therefore, in order to apply graphene to a channel layer of a semiconductor device, a technique that can form and control the band gap should be needed. For this, a method for synthesizing a graphene having an one-dimensional nanoribbon structure using an etching process has conventionally been studied, but there was a problem that, during the etching process, graphene is physically damaged or defects are formed, thereby degrading the electrical properties of graphene.

In order to solve the above-mentioned problem, studies about a bilayer graphene capable of forming a band gap without the etching process have been performed. Specifically the bilayer graphene has a structure where graphene is stacked up in two layers, and the band gap can be formed and controlled without damage of graphene when electric field is applied perpendicular to the bilayer graphene.

In addition, the bilayer or multilayer graphene has superior electrical conductivity and diffusion barrier characteristics compared to a monolayer graphene, and thus it is expected to be applied for interconnects of electronic devices such as semiconductor and display device elements or for a coating film of a metal surface.

Conventionally, the bilayer or multilayer graphene can be produced from graphite by a mechanical exfoliation method, but this method has disadvantages in that the yield is low and the formation of a large area film is difficult. Also, the large-area bilayer or multilayer graphene films have been synthesized so far by transferring a monolayer graphene synthesized from chemical vapor deposition repeatedly twice or more, but there were problems that production costs are high, the process time is long, an unexpected damage (e.g., tearing or wrinkling or the like) occurs during transfer process or a residual material occurs from a transfer medium, thus affecting negatively on the performance of the electronic devices. Therefore, for the commercialization of the multilayer graphene such as a bilayer or trilayer graphene, there exists a need for a technique capable of directly synthesizing the multilayer graphene to form a large area.

DETAILED DESCRIPTION OF THE INVENTION

Technical Problem

It is an object of the present invention to provide a method for synthesizing a multilayer graphene directly on a substrate, without repeated transfer processes.

Technical Solution

In order to solve the problem, the present invention provides a method for synthesizing a multilayer graphene comprising: a step of forming a catalytic metal layer on a substrate, a step of heat treatment of the catalytic metal layer on the substrate with supplying methane gas, and a step of synthesizing a multilayer graphene on the heat-treated catalytic metal layer.

The catalytic metal layer may include one or more selected from the group consisting of copper (Cu), nickel (Ni), iron (Fe), platinum (Pt), aluminum (Al), cobalt (Co), ruthenium (Ru), palladium (Pd), chromium (Cr), magnesium (Mg), manganese (Mn), gold (Au), silver (Ag), molybdenum (Mo), rhodium (Rh), tantalum (Ta), tit anium (Ti), tungsten (W), uranium (U), vanadium (V), zirconium (Zr), and iridium (Ir), brass, bronze, and stainless steel.

The step of forming a catalytic metal layer on a substrate is performed using one or more methods selected from the group consisting of an electron-beam evaporation, a thermal evaporation, a laser molecular beam epitaxy (L-MBE), a pulsed laser deposition (PLD), an electro-plating method and a sputtering.

The step of heat treatment of the catalytic metal layer on a substrate with supplying methane gas is performed at a temperature ranging from 800° C. to 1100° C. for 10 to 120 minutes.

The step of synthesizing the multilayer graphene on the heat-treated catalytic metal layer may include a step of supplying a reaction gas containing a carbon source on the heat-treated catalystic metal layer to synthesize the multilayer graphene on the substrate at a room temperature to 1200° C., and a step of cooling the multilayer graphene-coated substrate.

The above carbon source may include one or more materials selected from the group consisting of a natural graphite, a synthetic graphite, a highly ordered pyrolytic graphite (HOPG), an activated carbon, a carbon monoxide, a carbon dioxide, a methane, an ethane, an ethylene, a methanol, an ethanol, an acetylene, a propane, a propylene, a butane, a butadiene, a pentane, a pentene, a cyclopentadiene, a hexane, a cyclohexane, a benzene, a toluene, a polymethyl methacrylate (PMMA), a polystyrene, a polyacrylonitrile (PAN), and PEDOT:PSS.

In the step of synthesizing a multilayer graphene, the synthesis time of the multilayer graphene can be adjusted to adjust the number of layers of the graphene.

In the step of synthesizing a multilayer graphene, the synthesis of the multilayer graphene may be performed for 10 minutes to 20 minutes to form a bilayer graphene.

Advantageous Effects of the Invention

According to the present invention, the multilayer graphene having a large area can be grown directly on a substrate, by pre-heat-treating the catalytic metal layer with supplying methane gas prior to the synthesis step of graphene.

Also, it can be realized to simplify the production process and reduce production costs compared to a traditional production method of a multilayer graphene through the repeated synthesis and transfer processes of a monolayer graphene.

In addition, the number of layer of graphene can be controlled with the growth time. So, the multilayer graphene with the desired number of layers can be easily produced.

However, it will be understood clearly by a person skilled in the art that the effect of the invention is not limited to the above mentioned effects, and the other effects that are not mentioned herein may be derived from following descriptions.

DETAILED DESCRIPTION OF THE EMBODIMENTS

Figure 1:
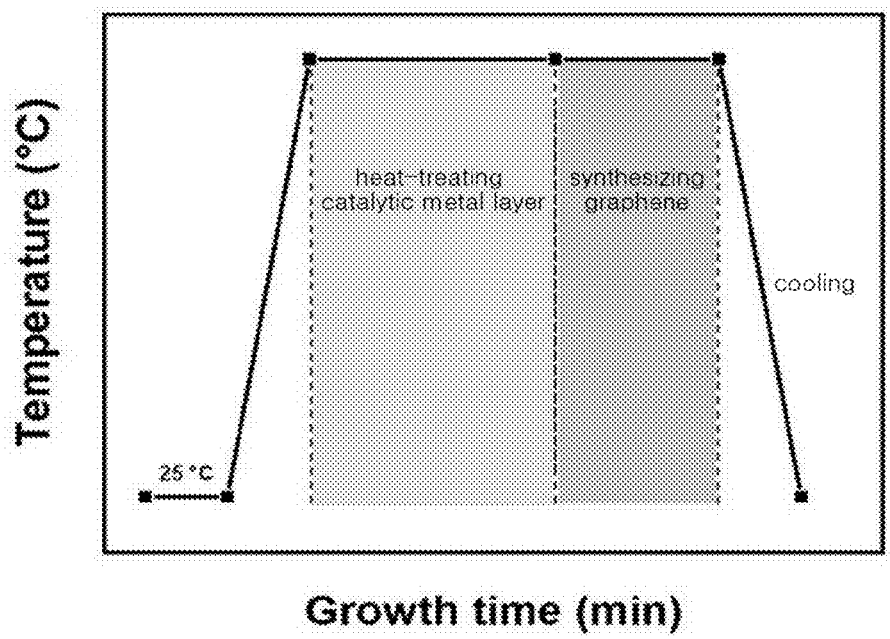
FIG. 1 is a diagram illustrating the method for synthesizing a multilayer graphene in accordance with one embodiment of the present invention.

Below, embodiments of the present invention will be described in detail with reference to the accompanying drawings.

While a plurality of modifications and variations can be made to the present invention, specific embodiments thereof will be illustrated and represented in the drawings and described in the following. However, these embodiments are not intended to limit the invention to particular forms disclosed herein, and rather the present invention includes all modifications, equivalents and alternatives that are consistent with the spirit of the invention as defined by the claims.

In the drawings, the thickness of layers and area may be enlarged or reduced for clarity. The same reference numbers throughout the disclosure indicate the same components.

The present invention can provide a method for synthesizing a multilayer graphene. Specifically, the method for synthesizing a multilayer graphene may comprise 1) a step of forming a catalytic metal layer on a substrate, 2) a step of heat-treating the catalytic metal layer on the substrate with supplying methane gas, and 3) a step of synthesizing a multilayer graphene on the heat-treated catalytic metal layer.

Specifically, in the method for synthesizing a multilayer graphene according to the present invention, the step 1) is a step of forming a catalytic metal layer on a substrate.

The above-described substrate is a supporting substrate for the synthesis of graphene to be described later. When transferring the multilayer graphene synthesized in a subsequent process to a target substrate, the above substrate may be a substrate for growth, and it can be applied directly to an electronic device without transferring the multilayer graphene produced according to the examples. That is, the substrate can be applied directly to semiconductor interconnects depending on the type of the substrate or can be used to transfer to the desired substrate via a typical transfer process. When the substrate is applied directly to the electronic device, the substrate that may be used herein includes a conventional material that can be applied to the electronic device. For example, the substrate may include a sapphire ($Al_2O_3$) substrate, a Si substrate, a $Si/SiO_2$ substrate, a polyethyleneterephthalate (PET) substrate, a polyethylene naphthalate (PEN) substrate, a polyimide substrate, a polycarbonate substrate, a polymethyl methacrylate (PMMA) substrate, a flexible substrate, or a metal substrate, but is not limited thereto.

The catalytic metal layer may be a layer to act as a catalyst of graphene growth for the synthesis of graphene to be described later. Specifically, the catalytic metal layer may include one or more materials selected from the group consisting of copper (Cu), nickel (Ni), iron (Fe), platinum (Pt), aluminum (Al), cobalt (Co), ruthenium (Ru), palladium (Pd), chromium (Cr), magnesium (Mg), manganese (Mn), gold (Au), silver (Ag), molybdenum (Mo), rhodium (Rh), tantalum (Ta), titanium (Ti), tungsten (W), uranium (U), vanadium (V), zirconium (Zr), iridium (Ir), brass, bronze, and stainless steel. In one embodiment of the present invention, when using a copper (Cu) as the catalytic metal layer, a step of removing a natural oxide film on the copper surface may be involved prior to the synthesis step of graphene. The process of removing a natural oxide film may comprise, for example, performing a heat treatment of hydrogen gas, or removing an oxide film using acetic acid or diluted hydrochloric acid, but is not limited thereto.

The step of forming a catalytic metal layer on a substrate may be performed using one or more methods selected from the group consisting of an electron-beam evaporation deposition method, a thermal evaporation deposition method, a laser molecular beam epitaxy (L-MBE), a pulsed laser deposition (PLD), an electro-plating method and a sputtering method.

According to one embodiment of the present invention, the catalytic metal layer may have a patterned structure. If the catalytic metal layer has a patterned structure, the graphene formed on the catalytic metal layer via the synthesis process of graphene to be described later may have a patterned structure. This may be applied by varying the structure depending on the pattern of graphene to be produced and thus it is not particularly limited.

In the method for produced a multilayer graphene according to the present invention, the step 2) is a step of heat-treating of the catalytic metal layer on the substrate with supplying methane gas.

FIG. 1 is a diagram illustrating a method for produced a multilayer graphene in accordance with an embodiment of the present invention.

As shown in FIG. 1, the method of the present invention may, before performing a conventional synthesis procedure of graphene, perform a step of heat-treating the catalytic metal layer formed on the substrate with supplying methane gas. Specifically, methane gas is supplied onto the catalytic metal layer, and the step of heat-treating the catalytic metal layer may be performed at a temperature ranging from 800° C. to 1100° C. for 10 to 120 minutes. In one embodiment of the present invention, when the substrate is placed in a reactor, heat is applied to the substrate while methane gas is supplied with an appropriate amount to the reactor, and thus the catalytic metal layer formed on the substrate may be subjected to heat treatment.

Figure 2:
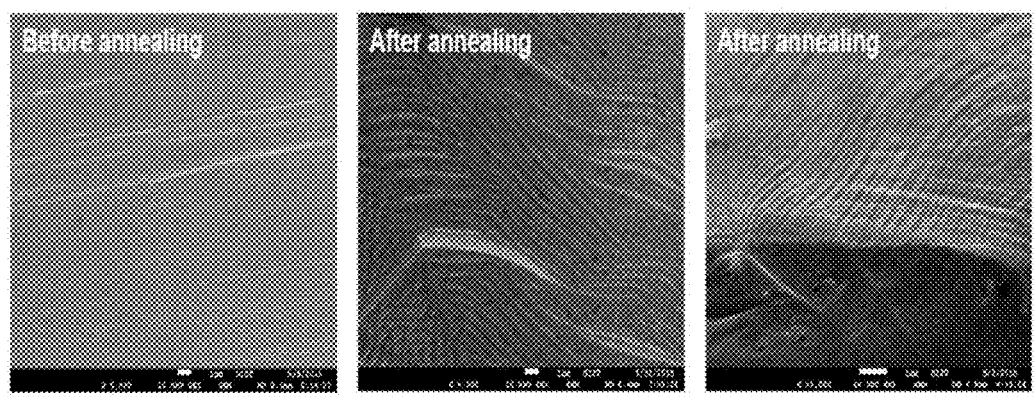
FIG. 2 is an image obtained by measuring, by a scanning electron microscopy (SEM), a change in the surface morphology of the catalytic metal layer by heat-treating the catalyst metal layer with supplying methane gas, prior to performing a synthesis procedure of graphene in accordance with one embodiment of the present invention.

FIG. 2 is an image obtained by measuring, by a scanning electron microscopy (SEM), a change in the surface morphology of the catalytic metal layer by heat-treating the catalytic metal layer on the substrate with suppyling methane gas, prior to performing a synthesis procedure of graphene in accordance with one embodiment of the present invention.

Referring to FIG. 2, when heat-treating the catalytic metal layer while supplying methane gas on the catalytic metal layer formed on the substrate, the surface morphology of the catalytic metal layer is changed and also the edge portion of the changed surface structure of the the catalytic metal layer may act as a seed capable of growing a multilayer graphene. That is, the catalytic metal layer having a planar shape forms asperities on the surface by a heat treatment using a methane gas, and allows the multilayer graphene to easily grow via a side surface of the asperities in the synthesis stage of graphene to be described later. Thus, the method of the present invention can improve the process in which the number of layer of graphene has been increased by repeating the transferring process after synthesis of graphene with a monolayer, when producing the conventional multilayer graphene. Also, the method of the present invention can allow the multilayer graphene to grow directly on the substrate without separately repeating the transfer step, and thereby it is possible to simplify the production process and reduce production costs. In addition, since the method of the present invention does not perform the transfer process to form a multilayer graphene, it can solve the problem that the quality of graphene is decreased in the transfer process, thus improving the quality of graphene.

In the method for synthesizing a multilayer graphene according to the present invention, the step 3) is a step of synthesizing a multilayer graphene on the heat-treated catalytic metal layer. Specifically, the step 3) may include a step of supplying a reaction gas containing a carbon source on the heat-treated catalytic metal layer to deposit a multilayer graphene on the substrate at a room temperature to 1200° C., and a step of cooling the multilayer graphene-deposited substrate.

The reaction gas containing a carbon source may include a carbon source, a hydrogen gas and an argon (Ar) gas. The reaction gas containing a carbon source acts as a precursor for the synthesis of graphene, and the carbon source may be a main material of graphene. The hydrogen gas may break a weak C—C bond during the growth of graphene, and thus it can affect the grain shape and size of the synthesized graphene. In addition, the above-mentioned argon (Ar) gas can be used to dilute the concentration of the carbon source. When the synthesis procedure of the graphene is performed in vacuum, the argon gas may acts as venting gas to control gas the vacuum pressure during the synthesis of graphene or to increase the pressure from the vacuum to the atmospheric pressure after the synthesis of graphene.

The growth temperature of the multilayer graphene may vary depending on the type of the carbon source. Specifically, the carbon source may include one or more materials selected from the group consisting of a natural graphite, a synthetic graphite, a highly ordered pyrolytic graphite (HOPG), an activated carbon, a carbon monoxide, a carbon dioxide, a methane, an ethane, an ethylene, a methanol, an ethanol, an acetylene, a propane, a propylene, a butane, a butadiene, a pentane, a pentene, a cyclopentadiene, a hexane, a cyclohexane, a benzene, a toluene, a polymethyl methacrylate (PMMA), a polystyrene, a polyacrylonitrile (PAN), and PEDOT:PSS.

Specifically, in one embodiment of the present invention, the step of synthesizing a multilayer graphene used herein may include a chemical vapor deposition (CVD). The chemical vapor deposition method may include, for example, a rapid thermal chemical vapor deposition (RTCVD), an inductively coupled plasma-chemical vapor deposition (ICP-CVD), a low pressure chemical vapor deposition (LPCVD), an atmospheric pressure chemical vapor deposition (APCVD), a metal organic chemical vapor deposition (MOCVD), or a plasma-enhanced chemical vapor deposition (PECVD), but it is not limited thereto.

In addition, when a heat treatment is involved depending on the type of the carbon source during the synthesis of the multilayer graphene, one or more heat sources selected from the group consisting of microwave, ultraviolet, plasma, laser and heater can be used, but are not limited thereto.

Subsequently, as shown in FIG. 1, the substrate on which the multilayer graphene is synthesized may be cooled at room temperature. The multilayer graphene grown on the substrate may allow the synthesized graphene to uniformly arrange through the cooling step, thereby improving the crystallinity of graphene. The cooling step may perform by using a conventional cooling device or through natural cooling.

In the step of synthesizing a multilayer graphene, the number of layer of the multilayer graphene can be adjusted by controlling the synthesis time of multilayer graphene. Specifically, in the stage of synthesizing the multilayer graphene, the synthesis of the multilayer graphene may be performed for 10 minutes to 20 minutes to form a bilayer graphene. That is, the method of the present invention performs a heat treatment for the catalytic metal layer by using methane gas prior to the synthesis step of graphene, in which the surface morphology is changed, thereby forming not only a monolayer graphene but also a multilayer graphene with a plurality of layers. Specific example thereof will be described by way of the examples and drawings below.

Below, preferred embodiments will be provided in order to assist in the understanding of the present disclosure. However, these examples are provided only for illustration of the present invention, and should not be construed as limiting the present invention to these examples.

EXAMPLE

Example 1: Preparation of Multilayer Graphene

After forming a copper thin film on the Si/SiO$_2$ substrate, it was placed in a reactor. Then, methane gas was supplied into the reactor, the temperature of the reactor was elevated to 1000° C., and the substrate on which the copper thin film was formed was then subjected to heat treatment for about one hour. Subsequently, the temperature of the reactor was maintained at 1000° C. while supplying additional hydrogen gas and argon (Ar) gas, and graphene was synthesized with differect synthesis times of 10~25 minutes and then cooled down to room temperature.

In order to analyze the characteristics of the synthesized graphene, PMMA was uniformly coated onto the surface of the graphene sample formed on the substrate at 2700 rpm for 60 seconds using a spin coater. Next, the PMMA on graphene was dried at 80° C. for 5 minutes using a convection oven to remove the solvent of PMMA, and then floated on a copper etchant to remove copper. Then, the graphene with PMMA was transferred to Si/SiO$_2$ substrate, and then exposed to acetone vapor to remove PMMA coated on the surface of graphene, whereby the graphene was transferred to the Si/SiO$_2$ substrate.

Comparative Example 1: Synthesis of Graphene in which the Catalytic Metal Layer was Heat-Treated with a Hydrogen Gas The graphene was synthesized by the same process as in Example 1, except that hydrogen gas was used instead of methane gas during the heat treatment of the copper thin film.

Figure 3:
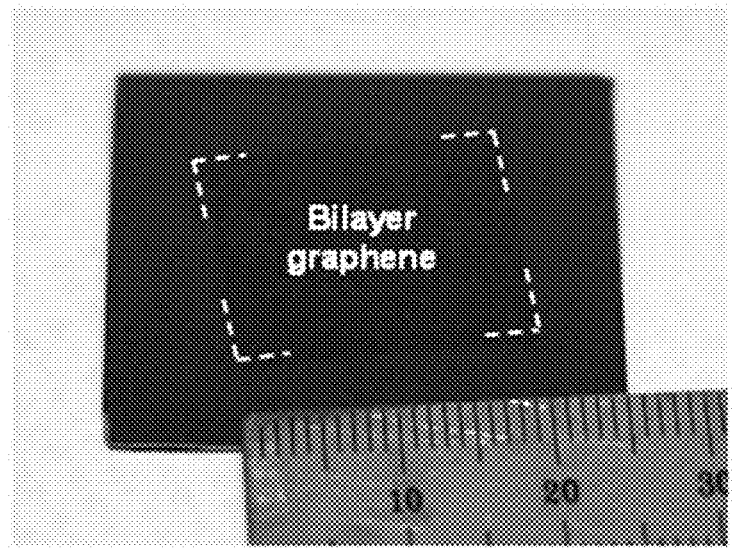
FIG. 3 is an image in which the graphene synthesized in Example 1 of the present invention is photographed by a digital camera.

FIG. 3 is an image in which the graphene produced in Example 1 of the present invention is photographed by a digital camera. Referring to FIG. 3, it can be confirmed that the bilayer graphene with a size of about 2×2 cm$^2$ was formed. Thereby, in the method for produced a multilayer graphene according to the present invention, because the multilayer graphene can be grown directly on a substrate and the area of graphene can be controlled depending on the area of the catalytic metal layer, the multilayer graphene with a large area can be easily synthesized by controlling the size of the catalytic metal layer.

Figure 4:
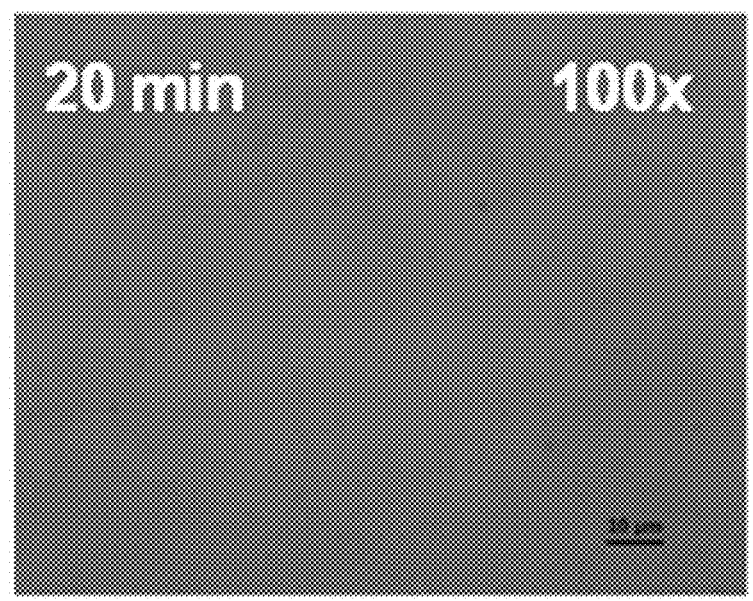
FIG. 4 is an image obtained by measuring the multilayer graphene synthesized in Example 1 of the present invention by an optical microscope.

FIG. 4 is an image obtained by measuring the multilayer graphene produced in Example 1 of the present invention by an optical microscope. Referring to FIG. 4, it can be confirmed that the contrast of the multilayer graphene is constant. This can mean that the graphene synthesized in Example 1 of the present invention is produced by a multilayer graphene with a homogeneous morphology.

Figure 5:
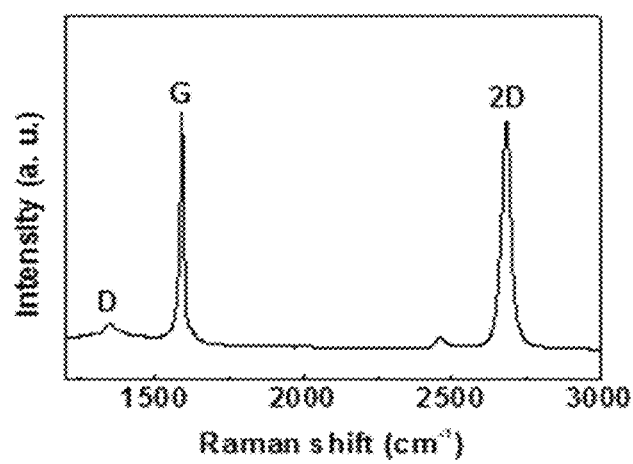
FIG. 5 is a diagram, showing the results measured by Raman spectroscopy, of the multilayer graphene synthesized in Example 1 of the present invention.

FIG. 5 is a diagram showing the results measured by Raman spectroscopy, of the multilayer graphene prepared in Example 1 of the present invention. The Raman spectroscopy is an analytical method which can grasp the formation of graphene, the number of layer of graphene and the degree of defect of graphene. Generally, the number of layer of graphene can be determined by the value of $I_{2D/G}$ and the degree of defect can be determined by the value of $I_{D/G}$. Referring to FIG. 5, the value of $I_{2D/G}$ of graphene prepared in Example 1 is approximately 1 and thus it can be confirmed that the bilayer graphene consisting of two layers of graphene is synthesized. Also, the value of $I_{D/G}$ is 0.2 or less and thus it can be confirmed that the bilayer graphene is synthesized with high quality that is almost free of defects.

Figure 6:
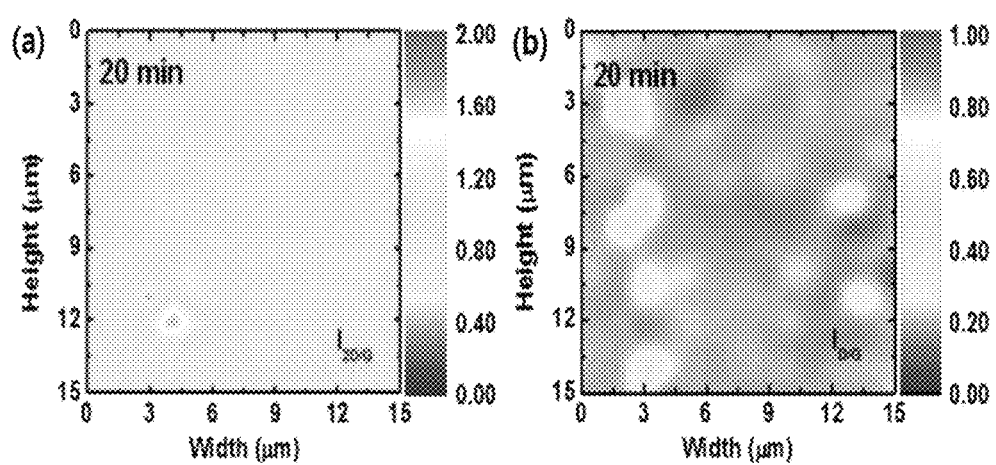
In FIG. 6, (a) and (b) are images, showing the results measured by Raman mapping, of the multilayer graphene synthesized in Example 1 of the present invention.

In FIG. 6, (a) and (b) are Raman mapping images of the multilayer graphene produced in Example 1 of the present invention (when the synthesis time of multilayer graphene is 20 minutes). Specifically, in order to confirm the large area synthesis and uniformity of the bilayer graphene produced in Example 1, the Raman mapping is performed to the area of 15×15 μm$^2$. Referring to FIG. 6, most area of the bilayer graphene shows the $I_{2D/G}$ value of about 1, and this may mean that the bilayer graphene is synthesized over 95% of entire area. Further, it can be confirmed that the monolayer graphene with the $I_{2D/G}$ value of about 2 and the multilayer graphene with the $I_{2D/G}$ value of 0.5 or less are partially synthesized. In addition, from the fact that value of $I_{D/G}$ was 0.2 on average, it can be confirmed that the graphene prepared in Example 1 is a large area and high quality graphene that is almost free of defects.

Figure 7:
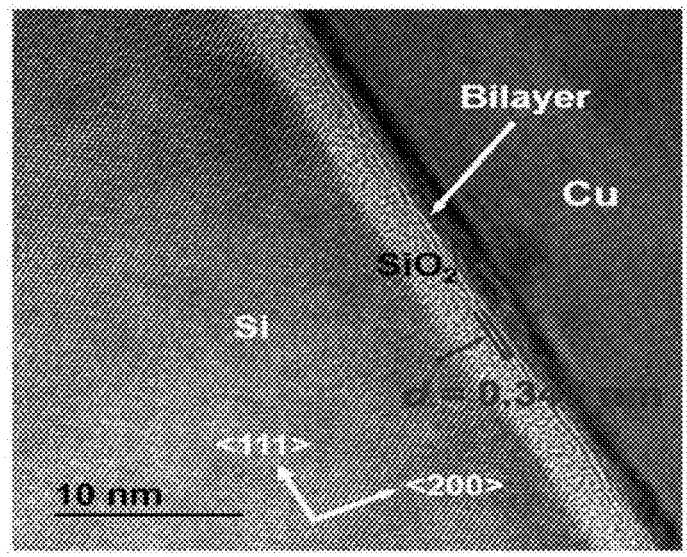
FIG. 7 shows a cross-sectional image, measured by a transmission electron microscopy (TEM), of the multilayer graphene (synthesis time of graphene is 20 minutes) synthesized in Example 1.

FIG. 7 shows a cross-sectional image, measured by a transmission electron microscopy (TEM), of the multilayer graphene produced in Example 1 of the present invention (when the synthesis time of multilayer graphene is 20 minutes). Referring to FIG. 7, the graphene consisting of two layers is observed on a silicon substrate. Also, it can be confirmed that the interlayer distance of the graphene is about 0.347 nm which shows a similar value to the interplanar distance of graphite (about 0.34 nm), and thus the bilayer graphene is synthesized.

Figure 8:
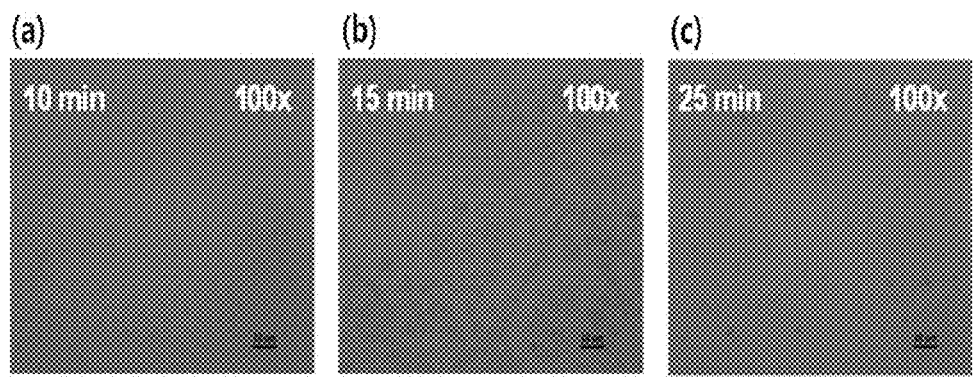
In FIG. 8, (a) to (c) show images measured by an optical microscope, of the multilayer graphene synthesized with different synthesis times in Example 1 of the present invention.

In FIG. 8, (a) to (c) show images, measured by an optical microscope, of the multilayer graphene produced with different synthesis times in Example 1 of the present invention. FIG. (a) shows the case where the synthesis time of multilayer graphene is 10 minutes, and confirms that the formed graphene is a monolayer and the contrast of graphene is constant, thereby a homogeneous graphene with a large area is formed. Fig(b) shows the case where the synthesis time of multilayer graphene is 15 minutes, and can confirm that a part with different contrast is generated and the bilayer graphene is formed in this part. Fig(c) shows the case where the synthesis time of multilayer graphene is 25 minutes, and confirms that compared with the case where the synthesis time of multilayer graphene of FIG. 4 is 20 minutes (⊚), a part with different contrast is generated and the trilayer graphene begins to form in a part of the area of the formed graphene. Therefore, in the method for synthesizing the multilayer graphene of the present invention, the synthesis time can be increased, thus increasing the number of layer of graphene, and it can be seen that, although the number of layer of graphene is increased, the quality of graphene can be maintained as it stands.

Figure 9:
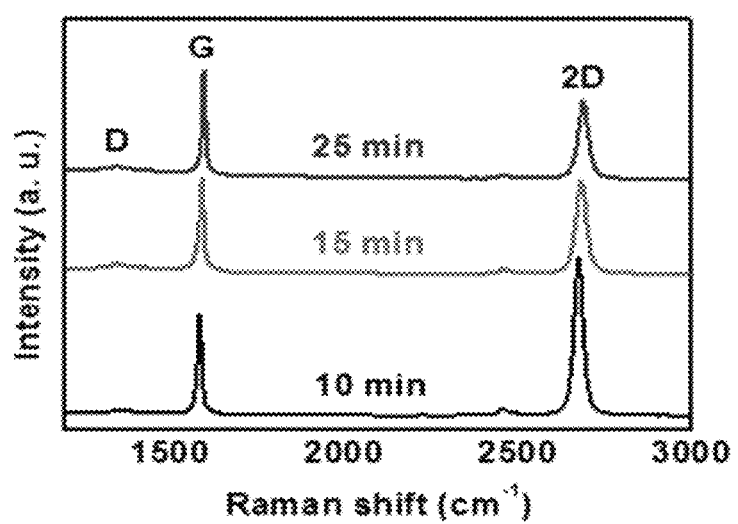
FIG. 9 shows a diagram illustrating the results measured by Raman spectroscopy, of the multilayer graphene synthesized with different synthesis times in Example 1 of the present invention.

FIG. 9 shows a diagram, illustrating the results measured by Raman spectroscopy, of the multilayer graphene produced with different synthesis times in Example 1 of the present invention. Referring to FIG. 9, it can be confirmed that since the $I_{2D/G}$ values of the graphene synthesized for 10 minutes and 25 minutes are 2 and 5, respectively, the monolayer graphene and the trilayer graphene are synthesized.

Figure 10:
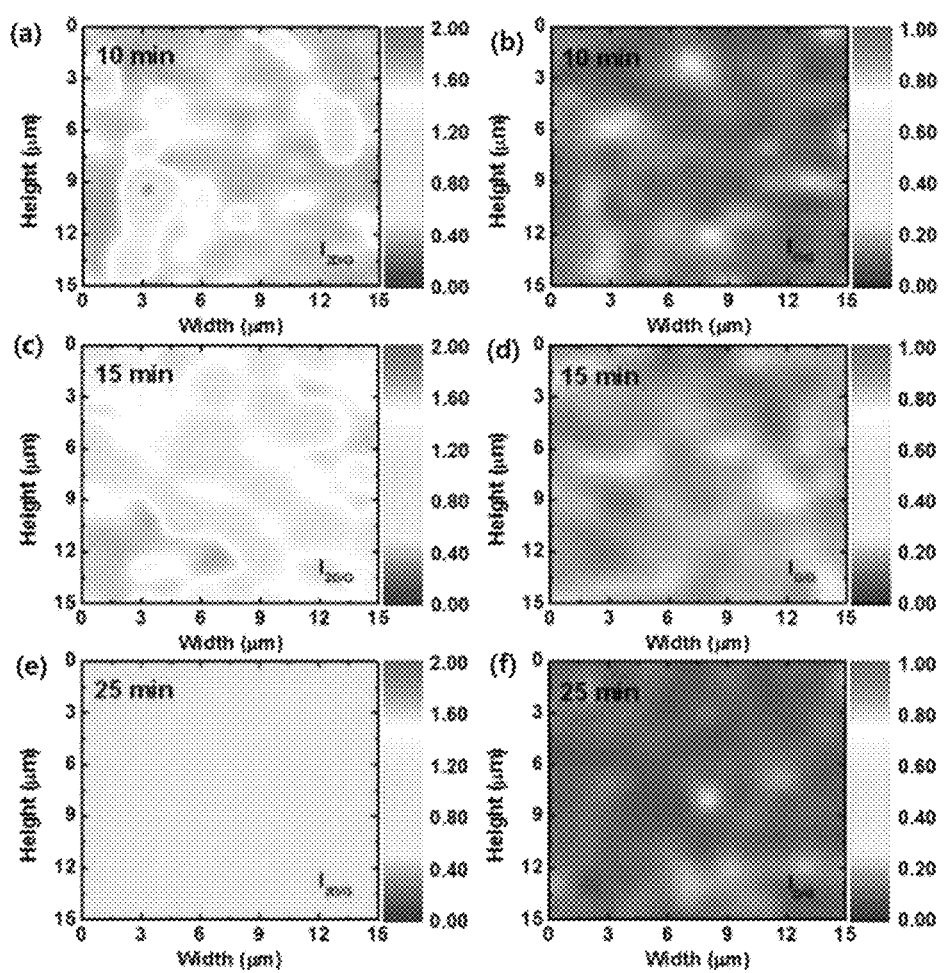
In FIG. 10, (a) to (f) show images, illustrating the Raman mapping results measured by Raman spectroscopy, of the multilayer graphene synthesized with different synthesis times in Example 1 of the present invention.

In FIG. 10, (a) to (f) show images, illustrating the results measured by Raman mapping, of the multilayer graphene produced with different synthesis times in Example 1 of the present invention.

In FIG. 10, (a) and (b) show the case where the synthesis time of multilayer graphene is 10 minutes, and it can be confirmed that most area over the area of 15×15 μm² shows the $I_{2D/G}$ value of about 2 and thus a monolayer graphine is synthesized over the large area. In FIG. 10, (c) and (d) show the case where the synthesis time of multilayer graphene is 15 minutes, and it can be confirmed that the area showing the $I_{2D/G}$ value of about 2 is reduced and the area showing the $I_{2D/G}$ value of about 1 is increased. This may mean that as the synthesis time of multilayer graphene is increased, the area of the monolayer graphene is reduced and the area of the bilayer graphene is increased. In FIG. 10, (e) and (f) show the case where the synthesis time of multilayer graphene is 25 minutes, and it can be confirmed that most of the $I_{2D/G}$ value is 1, but the area showing the $I_{2D/G}$ value of smaller than 1 is partially formed. This may mean that the trilayer graphene begins to form.

As described above, it can be confirmed that as the synthesis time of multilayer graphene is increased, the number of layer of graphene is increased over the large area. Also, it can be seen that since the average value of $I_{D/G}$ is 0.2 or less, a high quality graphene that is almost free of defects can be synthesized through the method for synthesizing the multilayer graphene of the present invention which synthesizes graphene after heat-treating the catalytic metal layer using methane gas regardless of the synthesis time.

Figure 11:
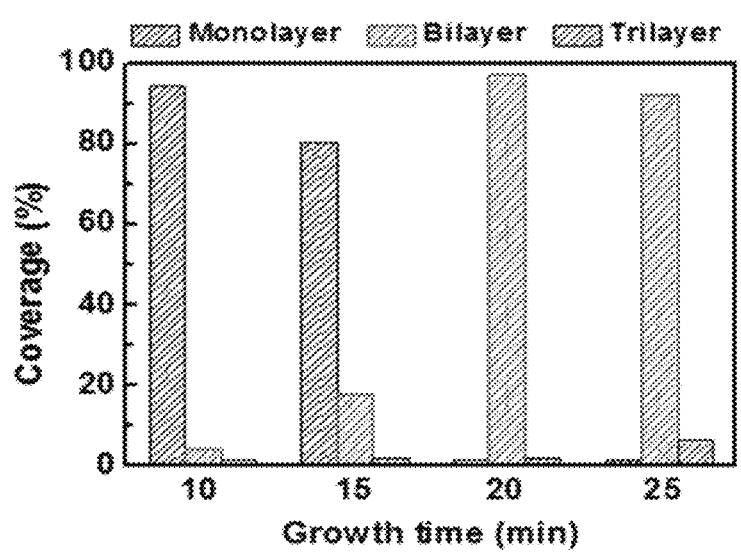
FIG. 11 shows a surface coverage distribution diagram of the number of layer of multilayer graphene with different synthesis times in accordance with Example 1 of the present invention.

FIG. 11 shows a surface coverage distribution diagram of the number of layer of multilayer graphene with different synthesis times in accordance with one embodiment of the present invention. Referring to FIG. 11, it can be confirmed that, when the synthesis time of multilayer graphene is 10 minutes, a monolayer graphene is synthesized. Also, it can be confirmed that as the synthesis time of multilayer graphene is increased from 10 minutes to 20 minutes, the area of the synthesized monolayer graphene is reduced and the area of the bilayer graphene is increased, whereby the bilayer graphene is synthesized when the synthesis time of multilayer graphene becomes 20 minutes. In addition, it can be confirmed that, when the synthesis time of multilayer graphene is longer than 20 minutes, the area of the bilayer graphene is reduced and the area of the trilayer graphene is increased.

Figure 12:
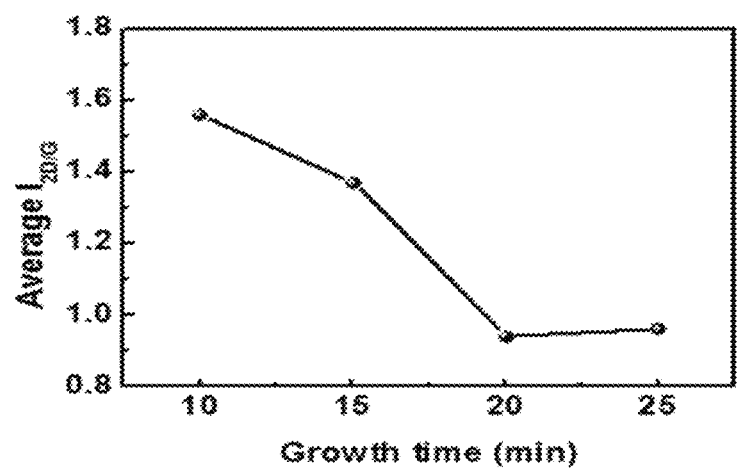
FIG. 12 shows a diagram, illustrating a change in the average $I_{2D/G}$ of Raman spectrum, of the graphene synthesized with different synthesis times in Example 1 of the present invention.

FIG. 12 shows a diagram, illustrating a change in the average $I_{2D/G}$ of Raman spectrum, of the graphene produced with different synthesis times in Example 1 of the present invention.

Figure 13:
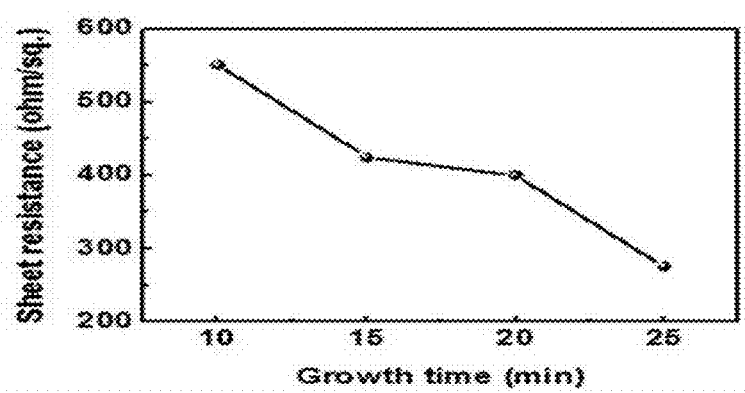
FIG. 13 shows a diagram, illustrating a change in the sheet resistance, of the graphene synthesized with different synthesis times in Example 1 of the present invention.

FIG. 13 shows a diagram, illustrating a change in sheet resistance, of the graphene produced with different synthesis times in Example 1 of the present invention. Referring to FIG. 13, it can be confirmed that when the synthesis time of multilayer graphene is 25 minutes, the sheet resistance of graphene is as low as 300 Ω/sq. Thus, in the method for synthesizing a multilayer graphene, the multilayer graphene is produced directly on the substrate. Since a multilayer graphene is not formed by repeatedly transferring a monolayer graphene, a mismatch and defects of the interface between graphene and graphene layers can be reduced significantly, thereby improving the electrical characteristics of graphene.

Figure 14:
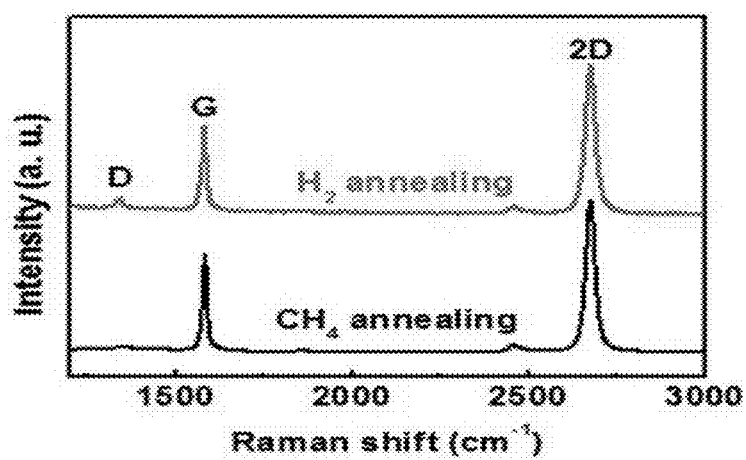
FIG. 14 shows a diagram, illustrating the result of Raman spectrum, of the multilayer graphene synthesized with different heat treatment gases in Example 1 of the present invention.

FIG. 14 shows a diagram, illustrating the result of Raman spectrum, of the multilayer graphene produced with different heat treatment gases in Example 1 of the present invention. Referring to FIG. 14, when heat-treated with methane gas (CH₄ annealing), there is almost no peak of D indicating a defect in graphene, and a higher quality graphene can be synthesized than when heat-treated with a hydrogen gas (H₂ annealing). Also, the sheet resistance of the monolayer graphene synthesized after heat treatment with methane gas is approximately 550 Ω/sq. and the sheet resistance of the monolayer graphene synthesized after heat treatment with hydrogen gas is approximately 640 Ω/sq. From these results, it can be seen that the sheet resistance of the monolayer graphene when heat-treated with methane gas is low.

On the other hand, examples of the present invention disclosed in the present specification and drawings are only provided only for illustration of particular examples to assist in the understanding of the present disclosure, and should not be construed as limiting the present invention to these examples. It will be apparent to those skilled in the art that, in addition to the examples disclosed herein, various modifications and changes can be made on the basis of the technical idea of the present invention.

What is claimed is:

1. A method for synthesizing a multilayer graphene, comprising:
    forming a catalytic metal layer on a substrate;
    forming a pattern of asperities on a surface of the catalytic metal layer by subjecting the catalytic metal layer to a heat treatment by supplying methane gas,
        wherein the pattern of asperities formed on the surface of the catalytic metal layer acts as a seed capable of growing the multilayer graphene; and
    depositing the multilayer graphene onto the surface of the catalytic metal layer having the pattern of asperities, comprising heat treating the catalytic metal layer in a gas comprising a carbon source, hydrogen and argon for a time according to a number of layer of the multilayer graphene to be formed.

2. The method for synthesizing a multilayer graphene according to claim 1, wherein the catalytic metal layer includes one or more selected from the group consisting of copper (Cu), nickel (Ni), iron (Fe), platinum (Pt), aluminum (Al), cobalt (Co), ruthenium (Ru), palladium (Pd), chromium (Cr), magnesium (Mg), manganese (Mn), gold (Au), silver (Ag), molybdenum (Mo), rhodium (Rh), tantalum (Ta), titanium (Ti), tungsten (W), uranium (U), vanadium (V), zirconium (Zr), and iridium (Ir), brass, bronze, and stainless steel.

3. The method for synthesizing a multilayer graphene according to claim 1, wherein the step of forming a catalytic metal layer on a substrate is performed using one or more methods selected from the group consisting of an electron-beam evaporation deposition method, a thermal evaporation deposition method, a laser molecular beam epitaxy (L-MBE), a pulsed laser deposition (PLD), an electroplating method and a sputtering method.

4. The method for synthesizing a multilayer graphene according to claim 1, wherein subjecting the catalytic metal layer to the heat treatment comprises heating the substrate at a temperature ranging from 800° C. to 1100° C. for 10 to 120 minutes.

5. The method for synthesizing a multilayer graphene according to claim 1, wherein depositing the multilayer graphene onto the surface of the catalytic metal layer comprises:
    supplying a reaction gas comprising a carbon source onto the surface having the pattern of asperities of the catalytic metal layer to form the multilayer graphene;
    causing the deposition of the multilayer graphene on the surface of the catalytic metal at a temperature ranging from a room temperature to 1200° C.; and
    cooling the multilayer graphene.

6. The method for synthesizing a multilayer graphene according to claim 5, wherein the carbon source includes one or more materials selected from the group consisting of a natural graphite, a synthetic graphite, a highly ordered pyrolytic graphite (HOPG), an activated carbon, a carbon monoxide, a carbon dioxide, a methane, an ethane, an ethylene, a methanol, an ethanol, an acetylene, a propane, a propylene, a butane, a butadiene, a pentane, a pentene, a cyclopentadiene, a hexane, a cyclohexane, a benzene, a toluene, a polymethyl methacrylate (PMMA), a polystyrene, a polyacrylonitrile (PAN), and PEDOT:PSS.

7. The method for synthesizing a multilayer graphene according to claim 1, wherein, in the stage of synthesizing the multilayer graphene, the number of layer of the multilayer graphene is controlled by changing the synthesis time of the multilayer graphene.

8. The method for synthesizing a multilayer graphene according to claim 1,
wherein depositing the multilayer graphene onto the surface of the catalytic metal layer comprises performing deposition of the multilayer graphene for a time ranging from 10 minutes to 20 minutes, and
wherein the multilayer graphene is a bilayer graphene.

9. The method according to claim 1, wherein forming the catalytic metal layer on the substrate comprises forming the catalytic metal layer directly on a substrate of an electronic device.

10. The method according to claim 1, wherein the catalytic metal layer comprises at least one metal selected from the group consisting of aluminum (Al), ruthenium (Ru), palladium (Pd), chromium (Cr), magnesium (Mg), manganese (Mn), silver (Ag), molybdenum (Mo), rhodium (Rh), tantalum (Ta), titanium (Ti), tungsten (W), uranium (U), vanadium (V), zirconium (Zr), and iridium (Ir).

* * * * *